US006070694A

United States Patent [19]

Burdett et al.

[11] Patent Number: 6,070,694

[45] Date of Patent: Jun. 6, 2000

[54] LOUDSPEAKER ASSEMBLY

[75] Inventors: Albert Burdett; Frank Sterns, both of Miami, Fla.; Doug Wright, Simi Valley, Calif.

[73] Assignee: Niles Audio Corporation, Inc., Miami, Fla.

[21] Appl. No.: 09/148,931

[22] Filed: Sep. 4, 1998

[51] Int. Cl.[7] ....... H05K 5/00

[52] U.S. Cl. ....... 181/150; 181/153; 181/154

[58] Field of Search ....... 181/141, 150, 181/153, 154, 199, 163; 381/386, 389

[56] References Cited

U.S. PATENT DOCUMENTS

| | | | |
|---|---|---|---|
| 3,976,838 | 8/1976 | Stallings, Jr. . | |
| 4,139,734 | 2/1979 | Finchman . | |
| 4,182,429 | 1/1980 | Senzaki . | |
| 4,441,577 | 4/1984 | Kurihara . | |
| 4,445,228 | 4/1984 | Bruni . | |
| 4,553,630 | 11/1985 | Ando . | |
| 4,811,406 | 3/1989 | Kawachi . | |
| 4,884,655 | 12/1989 | Freadman et al. . | |
| 4,917,212 | 4/1990 | Iwaya . | |
| 5,133,428 | 7/1992 | Perrson | 181/153 |
| 5,319,164 | 6/1994 | Shen | 181/150 |
| 5,400,407 | 3/1995 | Cassity et al. . | |
| 5,402,502 | 3/1995 | Boothroyd et al. . | |
| 5,859,917 | 1/1999 | Silbert et al. | 181/150 |

*Primary Examiner*—Khanh Dang
*Attorney, Agent, or Firm*—Lott & Friedland, P.A.

[57] ABSTRACT

A loudspeaker assembly with a transducer capable of being swiveled to direct the sound to a convenient point thereby allowing the listener to select the optimal direction of sound. The assembly comprises a unique design which prevents the transducer from dropping below the plane of the speaker's baffle, thereby eliminating diffraction of sound waves which arise when sound radiates off the sharp edge of the cavity wall upon rotation of the transducer. The assembly allows a listener to adjust a transducer, such as the high-range frequency tweeter component of an in-wall speaker to his liking, without the need to remove and/or re-install the speaker in the wall. The assembly is equally adaptable to the interior of a vehicle or for use as a free-standing floor speaker. The assembly provides a unique speaker with a pivoting transducer which provides quality, multi-directional sound, free from any distortion created by the diffraction of sound waves.

3 Claims, 4 Drawing Sheets

LOUDSPEAKER ASSEMBLY

TECHNICAL FIELD

This invention relates generally to a loudspeaker and in particular to a loudspeaker assembly with a swiveling transducer where the transducer protrudes through a central opening of a shell mounted in the speaker's baffle allowing it to be swiveled in any direction without sound waves being diffracted by their impinging upon the surface of the baffle.

BACKGROUND OF THE INVENTION

The home audio industry places great emphasis on convenience, and sound quality. In-wall audio speakers are at the height of their popularity. While floor speakers may at times, provide comparable sound quality, the aesthetic appeal of in-wall speakers and their ability to deliver high-quality sound without the need to rearrange one's living room to make space for the speakers, have created a significant demand for quality in-wall speakers that deliver the hi-fidelity sound of floor speakers.

Unfortunately, once in-wall speakers are mounted in a wall, they cannot simply be turned to redirect the sound as can be done with floor speakers without a great deal of effort and expense. One possible solution to such a dilemma is to make the in-wall speaker movable, so that the sound emanating from the speaker can be redirected without repositioning the entire speaker assembly. Such speakers, however, face a number of inherent difficulties. For instance, a speaker designed to allow sound drivers to rotate may inhibit the sound emanating from the sound drivers, thereby causing diffraction of the sound waves. In particular, when the surface of the mount in which the speaker is embedded rotates, a portion of the mount protrudes from the surface of the baffle, while, naturally the opposing portion recedes within and below the surface of the baffle. Sound emanating from the sound driver is reflected by the inner "wall" created by the receding portion of the mount. This reflection causes diffraction of the sound waves resulting in reduced quality of sound reproduction.

Previous attempts have been made to provide speakers with rotating components to direct sound for optimal listening such as are described in U.S. Pat. No. 5,402,502, to Boothroyd et al. (the '502 patent); U.S. Pat. No. 5,400,407, to Cassity et al. (the '407 patent); U.S. Pat. No. 5,133,428, to Perrson (the '428 patent); U.S. Pat. No. 4,917,212, to Iwaya (the '212 patent); U.S. Pat. No. 4,884,655, to Freadman et al. (the '655 patent); U.S. Pat. No. 4,811,406, to Kawachi (the '406 patent); U.S. Pat. No. 5,288,019, to Ando (the '019 patent); U.S. Pat. No. 4,553,630, to Ando (the '630 patent); U.S. Pat. No. 4,445,228, to Bruni (the '228 patent); U.S. Pat. No. 4,441,577, to Kurihara (the '577 patent); U.S. Pat. No. 4,139,734, to Fincham (the '734 patent); U.S. Pat. No. 4,182,429, to Senzaki. (the '429 patent); and U.S. Pat. No. 3,976,838 to Stallings, Jr., (the '838 patent), each of which is incorporated herein by reference.

The '502 patent describes a sound output system comprised of a baffle, a plurality of sound drivers, and a sound mirror. The sound mirror reflects a beam of sound from the sound driver horizontally and vertically while maintaining a generally consistent amplitude.

The '407 patent describes a tilt adjuster for a speaker which adjusts the position of a speaker recessed in a wall. The tilt-adjuster, preferably assembled with a speaker cover, is a wedge-shaped frame with an open central portion for receiving the speaker housing; a front side including a flattened perimeter for making abutting engagement with the speaker's housing; and a back side which attaches to the speaker's support frame.

The '428 patent shows a direction-adjustable speaker system comprised of a sound driver disposed within a rotatable mount positioned within a housing. The mount swivels within the housing to direct the sound to a desired location.

The '212 patent describes a speaker supporting unit which includes a base and a substantially disc-shaped spacer. The spacer includes a half-round groove through which a screw can be inserted to secure the spacer to the base. The first surface of the spacer, which determines the orientation of the speaker is determined by a combination of the inclined surface of the base and the second surface of the spacer, which is varied by the relative angle between the base and the spacer.

The '655 patent describes a speaker cabinet having a pair of front wall segments adjacent to the ends of the cabinet, an intermediate forwardly opening cavity extending between the upper and lower front wall segments, a pair of large subwoofer speakers in the upper and lower front wall segments, and a swiveled movable center subcabinet having a woofer, mid-range speaker and a pair of tweeters. The subcabinet has a range of swivel movement horizontally about a vertical axis.

The '406 patent describes a compound speaker system comprising a woofer, a squawker, a tweeter, and a super tweeter. The squawker, tweeter and super tweeter are attached to a plate and this assembly is rotatably positioned within the cone of the woofer. The system can be designed where the tweeter and super tweeter are at an elevated position with respect to the squawker when the assembly is rotated within the cone of the woofer.

The '630 patent describes a speaker with a tweeter angle adjusting device. The tweeter can change direction by use of horizontal and vertical adjusting knobs and which are secured to horizontal shaft and vertical shafts, respectively, through the use of interlocking mechanisms.

The '228 patent shows a stereo audio system for a motorcycle including a housing for a radio receiver and speaker-mirror assemblies, mounted on base-socket assemblies, and threaded over mounting posts screwed into holes in the handlebars.

The '577 patent describes a direction-variable speaker system for car-audio devices comprising two speaker cases containing speaker units for different reproduction bands, and an intermediate case interposed between the two speaker cases. A first pivotal shaft and a rising angle setting mechanism connect the first speaker case with the intermediate case. Between the second speaker case and the intermediate case is a second pivotal shaft as well as a twisting angle setting mechanism. By using the rising angle and twisting angle mechanisms, both speaker cases can be varied with respect to their angles in rising amount and twisting amount.

The '734 patent describes a pivoting loudspeaker with a plurality of enclosures, wherein at least one of the enclosures is pivotably mounted with respect to another of the enclosures, and a light emitting device which is visible through an aperture only when a listener is in correct listening position.

The '429 patent shows a loud-speaker system particularly suitable for use in car stereo systems, comprising at least a tweeter, with a woofer arranged coaxially to the tweeter wherein the tweeter is adjustably mounted to the woofer in order to allow manual regulation of the position of the tweeter to that of the woofer.

The '838 patent describes a sound reproduction system comprised of a plurality of speakers, said system being mounted in a wall.

None of the devices mentioned above describe a loudspeaker assembly with a swiveling transducer capable of rotation in any direction without inhibiting the sound from the transducer upon swiveling.

Therefore, there is a need in the art for a loudspeaker assembly that can allow a listener to swivel a transducer to obtain optimal dispersion control after installation of the speaker.

There is a further need in the art for a loudspeaker assembly which can be mounted in the baffle of an in-wall speaker and direct the sound to obtain the "sweet spot" without any diffraction or distortion of sound caused by the sound waves radiating off the sharp inner edge of the baffle created by the swiveling of the transducer.

There is a further need in the art for a loudspeaker assembly that can allow a listener to swivel a transducer to obtain optimal dispersion control after installation of the speaker within a vehicle.

Finally, there is yet a need in the art for a loudspeaker assembly having the features of the present invention whereby the loudspeaker assembly is a free-standing floor speaker.

SUMMARY OF THE INVENTION

The present invention solves significant problems in the art by providing a loudspeaker assembly capable of redirecting sound transmission without requiring repositioning of the overall assembly.

Generally described, the loudspeaker assembly of the present invention comprises a baffle, a dome assembly substantially abutting the baffle and comprising a dome including a central opening and a transducer positioned adjacent to the dome such that sound from the transducer radiates through the central opening, and means to swivel the dome assembly such that the sound radiating through the central opening is not obstructed by the inner rim of the recessed wall of the baffle.

In a preferred embodiment, the swivel means comprises a spring positioned substantially centrally behind and substantially adjacent to the dome assembly.

Accordingly, it is an object of the present invention to provide a loudspeaker assembly comprising a baffle, a dome assembly substantially abutting the baffle and comprising a dome including a central opening and a transducer positioned adjacent to the dome such that sound from the transducer radiates through the central opening, and means to swivel the dome assembly.

It is a further object of the present invention to provide a swivel means comprising a spring positioned substantially centrally behind and substantially adjacent to the dome assembly.

It is a further object of the present invention to position the dome assembly such that the sound radiating through the central opening is not obstructed.

These and other objects, features, and advantages of the present invention may be better understood and appreciated from the following detailed description of the embodiments thereof, selected for purposes of illustration and shown in the accompanying drawings.

DETAILED DESCRIPTION OF THE PREFERRED EMBODIMENT

Figure 1:
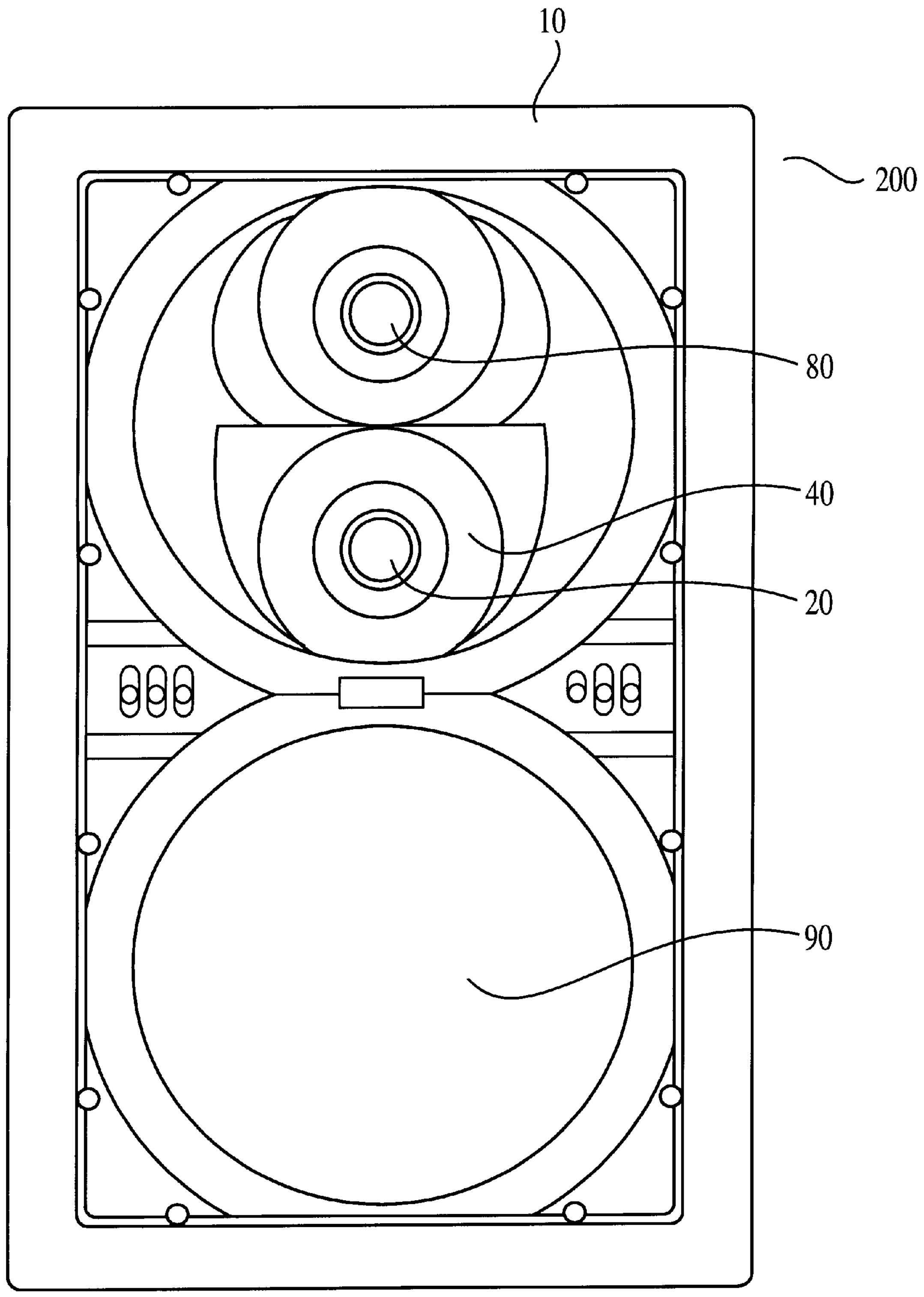
FIG. 1 is a top view of the preferred embodiment of the loudspeaker assembly having a baffle, mid-range transducer, swiveling high-frequency transducer, and low-range transducer.

Referring initially to FIG. 1 of the drawings, in which like numerals indicate like elements throughout the several views, in a preferred embodiment the loudspeaker assembly of this invention is generally illustrated by reference numeral 200.

The loudspeaker assembly 200 of the present invention is generally comprised of a baffle 10 having at least one cavity, a dome assembly 30 comprised of a dome 40, circular ring 50 and spring 60, a transducer 20, and a shell 70 which is mounted underneath the baffle 10 of the loudspeaker assembly 200. The baffle 10 is generally made of plastic and is generally rectangular in shape. Depending upon the size of the diameter of the cavity, a high-frequency transducer 20, mid-range frequency transducer 80, or low-range frequency transducer 90 are capable of being inserted within the loudspeaker assembly 200. The transducer 20 has a computer optimized hyperbolic shape to minimize distortion and maximize dispersion. However, other dimensions are available depending upon design choice. The larger size cavity retains the low-frequency transducer 90, commonly known as the woofer. The smallest cavity retains the mid-frequency transducer 80, known as the mid-range, while the third cavity retains the swiveling high-frequency transducer 20, commonly known as the tweeter. The woofer 90 is usually positioned at the lowest end of the loudspeaker assembly. This configuration can be seen in FIG. 1. In the preferred embodiment, the high-frequency transducer, or tweeter, is the transducer 20 capable of being swiveled. However, in alternate embodiments, any of the transducers are capable of being swiveled.

In the preferred embodiment of the present invention, the loudspeaker assembly 200 is an in-wall speaker permanently affixed within a wall opening or within a ceiling opening. However, in an alternate embodiment, the loudspeaker assembly 200 comprises a stand-alone floor speaker. Although the dimensions of the loudspeaker assembly 200 may be somewhat larger than those described in the preferred embodiment, the orientation of the components and manner of swiveling the transducer 20 is identical to that of the in-wall loudspeaker assembly. In yet another embodiment, the loudspeaker assembly is mounted within the interior of a vehicle. In this particular embodiment, the baffle 10 actually becomes part of the ceiling, side door, or other portion of the interior of the vehicle. The dome 40 and transducer 20 therein protrude outwardly from the plane of the vehicle's interior surface thereby allowing the rider of the vehicle to easily adjust the direction of the dome 40, thereby directing the sound within the vehicle to his or her preference.

Figure 4:
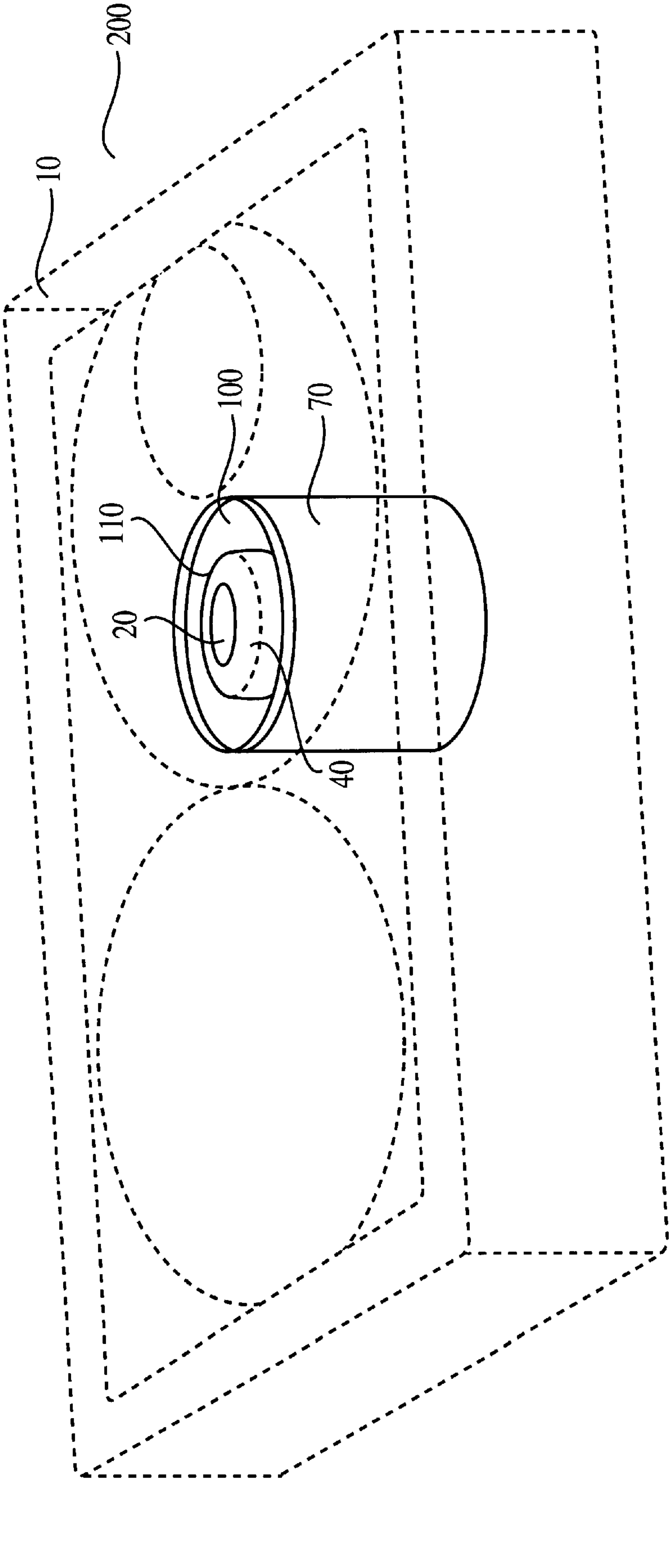
FIG. 4 is a perspective view of the dome containing the transducer protruding through the cavity in the baffle.

At least one cavity in the baffle 10 is defined by a recessed wall 100. This can best be seen in FIG. 2 and FIG. 4. The recessed wall 100 has an inner rim 110 which defines the cavity through which the dome 40 and swiveling transducer 20 protrude. This wall 100 is particularly sloped, or recessed. The interface of the dome portion 40 of the dome assembly 30 and sloped, recessed wall 100 is critical as it allows the dome portion 40 containing the swiveling transducer 20 to maintain substantially continuous contact with the inner rim 110 of the recessed wall 100. Prior attempts to design a transducer have encountered the problem of the sharp edge (or inner rim) created when the transducer, upon pivoting, drops below this edge thereby inhibiting the sound emanating from the transducer as it radiates off the created edge. The present invention corrects this problem.

The hi-frequency transducer to be swiveled 20 is contained within a dome assembly 30 comprised of a dome 40, a spring 60 and a circular ring 50. The dome 40 has a central opening 45 to enable the transducer 20 to protrude through the dome 40. The dome assembly 30, the transducer 20 and the shell 70 can be seen in the exploded view of FIG. 3. The swiveling transducer 20 protrudes through the central opening 45 of the dome 40 and is secured therein between the dome 40, circular ring 50 and spring 60 by conventional means such as a plurality of screws. A protective covering can be placed over the central opening 45 in the dome 40 to protect the transducer 20. When the dome assembly 30 is properly secured to the baffle 10, the dome 40 maintains continuous contact with the inner rim 110 of the recessed wall 100. The dome 40 and transducer 20 contained therein, can be swiveled in any direction. The dome 40 is designed, upon its swiveling, to prevent the transducer 20, from coming into substantial contact with, or dropping substantially below the sharp inner rim 110 of the recessed wall 100. This allows sound to exit the transducer 20 in an unobstructed manner thereby eliminating diffraction of sound waves emanating from the transducer 20. In conventional speakers having pivoting sound components, any substantial space created between the dome 40 and the inner rim 110 obstructs the sound emanating from the transducer 20 as it radiates off the surface of the baffle 10 creating diffraction of sound waves as they impinge against a sharp edge of the loudspeaker assembly. The present invention avoids this by preventing the dome 40 and transducer 20 therein from dropping below the surface of the baffle 10.

Figure 3:
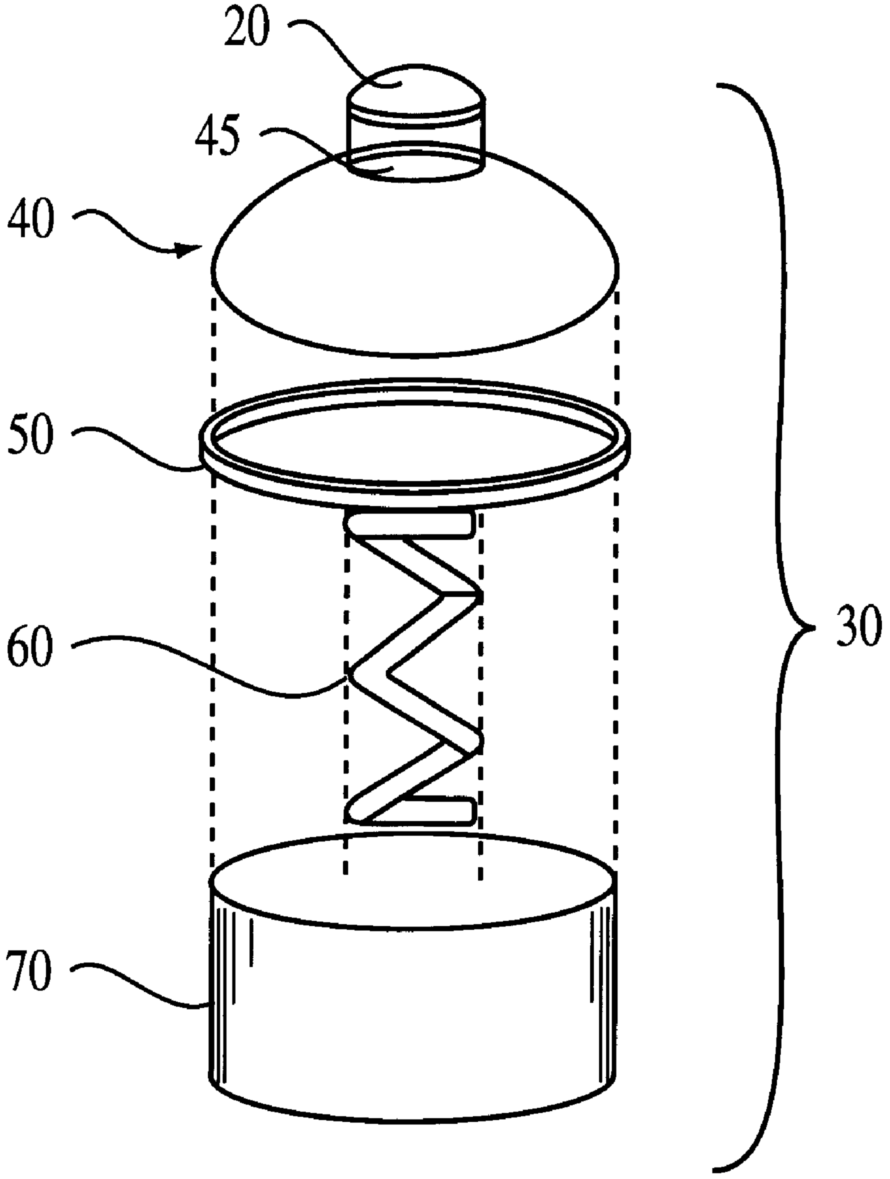
FIG. 3 is an exploded view of the transducer and dome assembly including its dome portion, circular ring, and spring, and shell.

Positioned immediately below the cavity that retains the dome assembly 30 and the transducer 20 contained therein, is a shell 70 which is mounted within the loudspeaker assembly 200 and substantially behind the baffle 10. The shell 70 is of a circular shape to conform to the shape of the cavity under which it is positioned. Its diameter is larger than that of the cavity and the shell 70 is secured to the baffle 10 by conventional affixing means. The shell 70, depicted in FIG. 3, is preferably but not necessarily approximately 2 inches deep and defines a hole in its bottom surface for allowing wires from the transducer 20 to exit the shell 70 and connect to various electrical components situated within the loudspeaker assembly 200.

Figure 2:
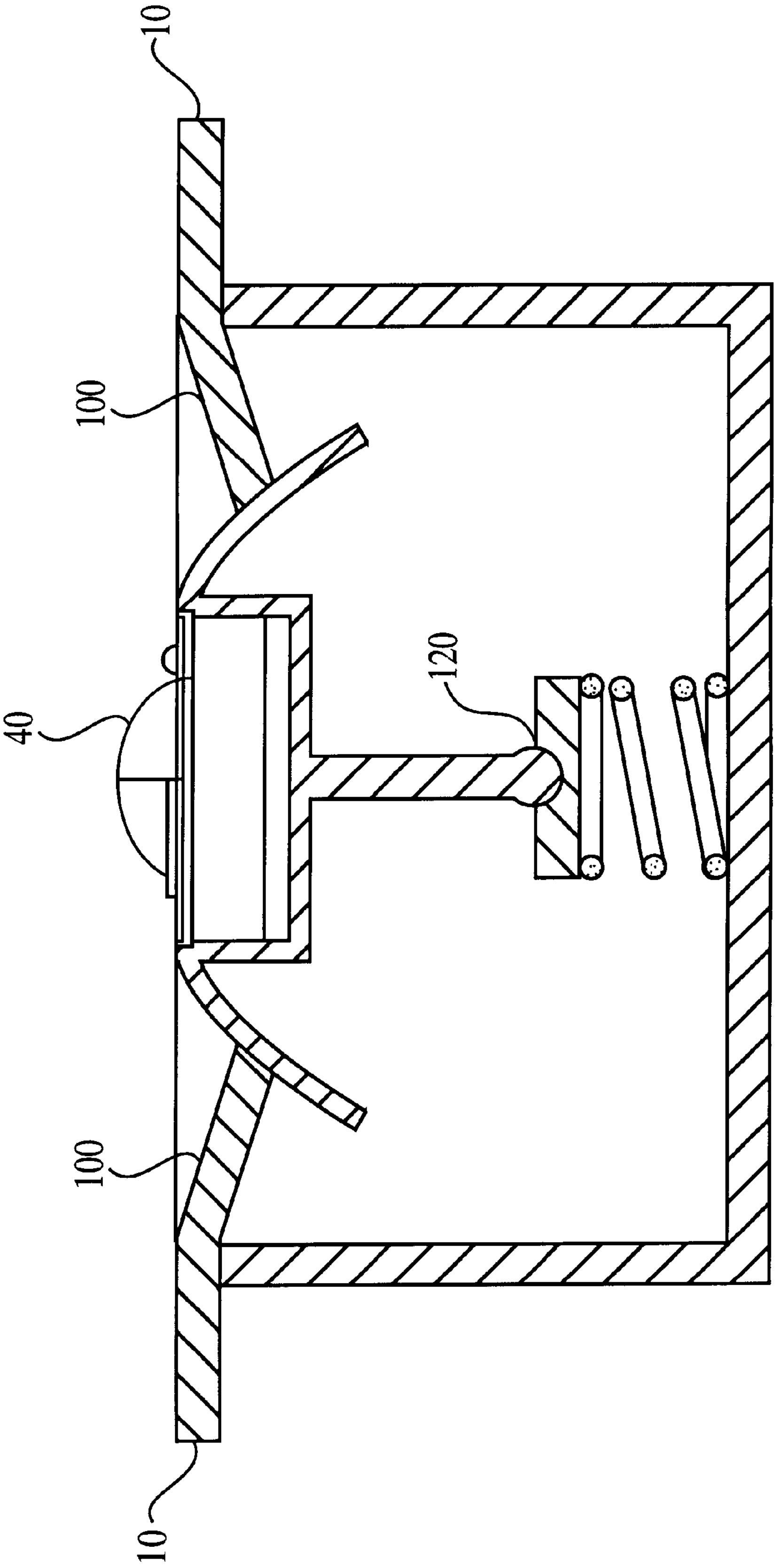
FIG. 2 is a side view of the dome protruding through the recessed wall.

The dome assembly 30 is secured within the shell 70 by means of a spring 60 positioned substantially centrally behind and substantially adjacent to the dome 40. The spring 60 applies pressure to the dome assembly 30 thereby allowing the dome assembly 30 to remain in contact with the rear portion of the baffle 10. FIG. 2 also depicts a ball-and-socket configuration 120, positioned between the dome 40 and the spring 60. This design, together with the interface of the dome 40 and recessed wall 100, creates a unique, dual ball-and-socket relationship. Those well-versed in the art will recognize that this configuration 120 is but one of a variety of manners in which the spring 60 can interface with the dome 40. In the preferred embodiment, the spring 60 comes into contact with the interior of the shell 70 and is positioned at a distance well below the dome assembly 30 to provide for a greater range of motion when the dome assembly 30 and transducer 20 are swiveled within its cavity.

The dome assembly 30 containing the transducer 20 can be swiveled either manually or by other means such as a remote controller which transmits signals to a receiver embedded within the loudspeaker assembly.

In an alternate embodiment of the present invention, the transducer 20 is mounted within the cavity in a conventional fashion. A circular aperture is defined about its center wherein a second transducer can be concentrically mounted within the aperture. A typical arrangement is for the second concentrically-mounted transducer to be a high-range frequency transducer, while the swiveling transducer mounted within the cavity to be a mid-range frequency transducer.

Accordingly, it will be understood that the preferred embodiment of the present invention has been disclosed by way of example and that other modifications and alterations may occur to those skilled in the art without departing from the scope and spirit of the appended claims.

We claim:

1. A loudspeaker assembly comprising:

a baffle including a recessed wall having an inner rim;

a dome assembly substantially abutting said baffle and comprising a dome including a central opening and a transducer positioned adjacent said dome such that sound from said transducer radiates through said central opening;

means to swivel said dome assembly such that said sound radiating through said central opening is not obstructed by said inner rim of said recessed wall of said baffle.

2. The loudspeaker assembly of claim 1, wherein said swivel means comprises a spring positioned substantially centrally behind and substantially adjacent to said dome assembly.

3. A loudspeaker assembly, comprising:

a baffle;

a dome assembly substantially abutting said baffle and comprising a dome including a central opening and a transducer positioned adjacent said dome such that sound from said transducer radiates through said central opening; and means to swivel said dome assembly such that said sound radiating through said central opening is not obstructed by said inner rim of said recessed wall of said baffle, comprising a spring positioned substantially centrally behind and substantially adjacent to said dome assembly.

* * * * *